(12) United States Patent
Kusumoto et al.

(10) Patent No.: US 7,045,403 B2
(45) Date of Patent: *May 16, 2006

(54) METHOD FOR PRODUCING INSULATED GATE THIN FILM SEMICONDUCTOR DEVICE

(75) Inventors: Naoto Kusumoto, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/903,339

(22) Filed: Jul. 10, 2001

(65) Prior Publication Data

US 2001/0045563 A1 Nov. 29, 2001

Related U.S. Application Data

(63) Continuation of application No. 09/375,308, filed on Aug. 16, 1999, now Pat. No. 6,265,745, which is a continuation of application No. 08/604,547, filed on Feb. 21, 1996, now Pat. No. 5,953,597.

(30) Foreign Application Priority Data

Feb. 21, 1995 (JP) .............................. 7-56481

(51) Int. Cl.
*H01L 21/00* (2006.01)
*H01L 21/84* (2006.01)

(52) U.S. Cl. ...................... 438/161; 438/164
(58) Field of Classification Search ................ 438/164, 438/174, 151, 152, 160–162, 163, 166, 517, 438/535, 149, 487, 514; 757/72, 350, 607, 757/59

See application file for complete search history.

(56) References Cited

U.S. PATENT DOCUMENTS 3,848,104 A 11/1974 Locke
4,046,618 A 9/1977 Chaudhari et al.
4,059,461 A 11/1977 Fan et al.

(Continued)

FOREIGN PATENT DOCUMENTS

EP 598394 11/1993
JP 55-067132 5/1980 ................. 437/174
JP 57-072319 5/1982

(Continued)

OTHER PUBLICATIONS

Foti, et al., "Laser Annealing of Semiconductors", J.M. Poate (ed.) Epitaxy by Pulsed Annealing of Ion–Implanted Silicon, 1982, Academic Press, pp. 203–245.
Young, et al., "Effect of Pulse Duration on the Annealing of Ion Implanted Silicon With a XeCl Excimer Laser and Solar Cells", in Laser–Solid Interactions and Transient Thermal Processing of Materials, 1983, pp. 401–406.
Biegelsen, et al., "Laser–Inducted Crystallization of Silicon on Bulk Amorphous Substrates: An Overview" in Laser–Solid Interactions and Transient Thermal Processing of Materials, 1983, pp. 537–548.

Primary Examiner—Phat X. Cao
Assistant Examiner—Theresa T. Doan
(74) Attorney, Agent, or Firm—Fish & Richardson P.C.

(57) ABSTRACT

An amorphous miconductor film is etched so that a width of a narrowest portion thereof is 100 μm or less, thereby forming island semiconductor regions. By irradiating an intense light such as a laser into the island semiconductor regions, photo-annealing is performed to crystallize it. Then, of end portions (peripheral portions) of the island semiconductor regions, at least a portion used to form a channel of a thin film transistor (TFT), or a portion that a gate electrode crosses is etched, so that a region that the distortion is accumulated is removed. By using such semiconductor regions, a TFT is produced.

6 Claims, 8 Drawing Sheets

U.S. PATENT DOCUMENTS

| | | | |
|---|---|---|---|
| 4,083,272 A | 4/1978 | Miller | |
| 4,160,263 A | 7/1979 | Christy et al. | |
| 4,234,358 A | 11/1980 | Celler et al. | |
| 4,249,960 A | 2/1981 | Schnable et al. | |
| 4,309,225 A | 1/1982 | Fan et al. | |
| 4,328,553 A | 5/1982 | Fredriksen et al. | |
| 4,330,363 A | 5/1982 | Biegesen et al. | |
| 4,341,569 A | 7/1982 | Yaron et al. | |
| 4,370,175 A | 1/1983 | Levatter | |
| 4,409,724 A | 10/1983 | Tasch | |
| 4,439,245 A | 3/1984 | Wu | |
| 4,463,028 A | 7/1984 | Laude | |
| 4,468,551 A | 8/1984 | Neiheisel | |
| 4,468,853 A | 9/1984 | Morita et al. | |
| 4,469,551 A | 9/1984 | Laude | |
| 4,498,951 A * | 2/1985 | Tamura et al. | 117/43 |
| 4,545,823 A | 10/1985 | Drowley | |
| 4,599,133 A | 7/1986 | Miyao et al. | |
| 4,734,550 A | 3/1988 | Imamura et al. | |
| 4,764,485 A | 8/1988 | Loughran et al. | |
| 4,803,528 A | 2/1989 | Pankove | |
| 4,835,704 A | 5/1989 | Eichelberger et al. | |
| 4,862,227 A | 8/1989 | Tsuge et al. | |
| 4,937,618 A | 6/1990 | Ayata et al. | |
| 4,956,549 A | 9/1990 | Henning et al. | |
| 4,970,366 A | 11/1990 | Imatou et al. | |
| 5,145,808 A | 9/1992 | Sameshima | |
| 5,217,921 A | 6/1993 | Kaido et al. | |
| 5,219,786 A | 6/1993 | Noguchi | |
| 5,221,365 A | 6/1993 | Noguchi et al. | |
| 5,294,811 A | 3/1994 | Aoyama et al. | |
| 5,313,076 A | 5/1994 | Yamazaki et al. | |
| 5,352,291 A | 10/1994 | Zhang et al. | |
| 5,372,836 A | 12/1994 | Imahashi et al. | |
| 5,409,867 A * | 4/1995 | Asano | 438/487 |
| 5,413,958 A | 5/1995 | Imahashi et al. | |
| 5,424,244 A | 6/1995 | Zhang et al. | |
| 5,448,582 A | 9/1995 | Lawandy | |
| 5,477,073 A | 12/1995 | Wakai et al. | |
| 5,504,020 A | 4/1996 | Aomori | |
| 5,508,209 A | 4/1996 | Zhang et al. | |
| 5,523,257 A * | 6/1996 | Yamazaki et al. | 438/166 |
| 5,529,630 A | 6/1996 | Imahashi et al. | |
| 5,543,636 A | 8/1996 | Yamazaki | |
| 5,561,081 A | 10/1996 | Takenouchi et al. | |
| 5,569,610 A | 10/1996 | Zhang et al. | |
| 5,576,556 A | 11/1996 | Takemura et al. | |
| 5,578,520 A | 11/1996 | Zhang et al. | |
| 5,580,801 A | 12/1996 | Maegawa | |
| 5,589,406 A | 12/1996 | Kato et al. | |
| 5,608,232 A | 3/1997 | Yamazaki | |
| 5,608,251 A | 3/1997 | Konuma et al. | |
| 5,612,251 A | 3/1997 | Lee | |
| 5,622,814 A | 4/1997 | Miyata et al. | |
| 5,623,157 A | 4/1997 | Miyazaki et al. | |
| 5,643,801 A | 7/1997 | Ishihara et al. | |
| 5,648,277 A | 7/1997 | Zhang et al. | |
| 5,681,759 A | 10/1997 | Zhang | |
| 5,696,003 A | 12/1997 | Makita et al. | |
| 5,708,252 A | 1/1998 | Shinohara et al. | |
| 5,712,191 A * | 1/1998 | Nakajima et al. | 437/174 |
| 5,719,065 A | 2/1998 | Takemura et al. | |
| 5,739,549 A | 4/1998 | Takemura et al. | |
| 5,756,364 A | 5/1998 | Tanaka et al. | |
| 5,804,878 A | 9/1998 | Miyazaki et al. | |
| 5,821,138 A | 10/1998 | Yamazaki et al. | |
| 5,891,764 A | 4/1999 | Ishihara et al. | |
| 5,891,766 A | 4/1999 | Yamazaki et al. | |
| 5,939,731 A | 8/1999 | Yamazaki et al. | |
| 5,943,354 A | 8/1999 | Lawandy | |
| 5,945,711 A | 8/1999 | Takemura et al. | |
| 5,953,597 A | 9/1999 | Kusumoto et al. | |
| 5,956,105 A * | 9/1999 | Yamazaki et al. | 349/43 |
| 5,962,869 A | 10/1999 | Yamazaki et al. | |
| 5,962,872 A | 10/1999 | Zhang et al. | |
| 5,962,897 A | 10/1999 | Takemura et al. | |
| RE36,371 E | 11/1999 | Imahashi et al. | |
| 6,204,099 B1 * | 3/2001 | Kusumoto et al. | 438/151 |
| 6,413,805 B1 | 7/2002 | Zhang et al. | |
| 6,458,200 B1 | 10/2002 | Zhang | |

FOREIGN PATENT DOCUMENTS

| | | | |
|---|---|---|---|
| JP | 57-94482 | 6/1982 | |
| JP | 57-109322 | 7/1982 | |
| JP | 57-193291 | 11/1982 | |
| JP | 58-192381 | 11/1983 | |
| JP | 60-202931 | 10/1985 | |
| JP | 60-245172 | 12/1985 | |
| JP | 60-245173 | 12/1985 | |
| JP | 60-245174 | 12/1985 | |
| JP | 61-145819 | 7/1986 | 437/174 |
| JP | 62-104117 | 5/1987 | |
| JP | 62-250629 | * 10/1987 | |
| JP | 63-314862 | 12/1988 | |
| JP | 3-201538 | 9/1991 | |
| JP | 03-267374 | 11/1991 | |
| JP | 04-37144 | 2/1992 | |
| JP | 4282869 | 10/1992 | |
| JP | 04-286318 | 10/1992 | |
| JP | 5-152333 | 6/1993 | |
| JP | 05-267771 | 10/1993 | |
| JP | 5275336 | 10/1993 | |
| JP | 5-299339 | 11/1993 | |
| JP | 06-045272 | 2/1994 | |
| JP | 06-267989 | 9/1994 | |
| JP | 06-295859 | 10/1994 | |
| JP | 06-318701 | 11/1994 | |
| JP | 06-330322 | 11/1994 | |
| JP | 06-333950 | 12/1994 | |
| JP | 8-228006 | 9/1996 | |

* cited by examiner

FIG. 5F  ← A LEFT PART | A RIGHT PART →

METHOD FOR PRODUCING INSULATED GATE THIN FILM SEMICONDUCTOR DEVICE

This application is a continuation of U.S. application Ser. No. 09/357,308, filed Aug. 16, 1999 now U.S. Pat. No. 6,265,745, which is a continuation of U.S. application Ser. No. 08/604,547, filed Feb. 21, 1996 (now U.S. Pat. No. 5,953,597, issued Sep. 14, 1999). The U.S. application Ser. No. 08/604,547 claims priority under 35 USC §119 based on priority application serial no. 7-56481, filed Feb. 21, 1995, in Japan.

BACKGROUND OF THE INVENTION

1. Field of the Invention

The present invention disclosed in the specification relates to a method for producing a semiconductor device having a gate electrode using a crystalline thin film semiconductor, for example, a thin film transistor (TFT). As application of the TFT, an active matrix type liquid crystal display device has been known. This display device performs a fine and high resolution display by arranging a TFT as a switching element in each of several hundred thousands or more pixels disposed at a matrix form.

2. Description of the Related Art

Recently, a transistor using a thin film semiconductor formed on a glass or quartz substrate, such as a thin film transistor (TFT) has been concerned. A thin film semiconductor having a thickness of several 100 to several 1000 Å is formed on a surface of a glass substrate or a quarts substrate, and then the transistor (insulated gate field effect transistor) is formed using the thin film semiconductor.

Of such the TFT, a TFT using an amorphous silicon film and a TFT using a crystalline silicon film is used in practice. Since the TFT using the crystalline silicon film has a superior characteristic, it has a great future.

In the TFT using a crystalline silicon semiconductor, the crystalline silicon thin film is obtained by a method for thermal-annealing an amorphous silicon film, or a method for forming a crystalline silicon film directly using a vapor phase growth method. However, in order to perform the process at a low temperature, a photo-annealing for crystallizing an amorphous silicon film by irradiating an intense light such as a laser has been proposed. (for example, Japanese Patent Application Open No. 4-37144)

There are two methods roughly as a case wherein crystalline silicon film is obtained by photo-annealing includes. In a first method, photo-annealing is performed after etching a semiconductor thin film into a shape of an element to be formed. In a second method, after photo-annealing for an even (flat) film is performed, the film is etched into a shape of an element to be formed. In general, it has known that the element obtained by the first method has a superior characteristic (field effect mobility) than that obtained by the second method. This may be because in the first method, the film is contracted by photo-annealing, and thus a central portion of a pattern is stressed, thereby increasing crystallinity of the film.

However, there is a problem in this case. That is, although an initial characteristic is good, by use for a long period of time, the characteristic is deteriorated largely.

Figure 3A:
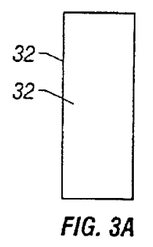
FIGS. 3A to 3D show schematic conventional producing processes (upper and cross section views)
Figure 3B:
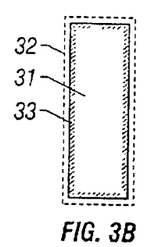
Figure 3C:
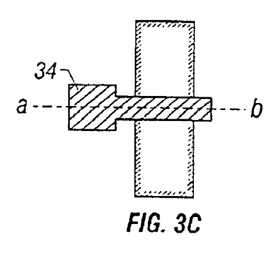

A cause that the characteristic is deteriorated by the conventional method will be explained with FIGS. 3A to 3D. Initially, an island semiconductor region 31 of amorphous silicon having a rectangle 32 is formed as shown in FIG. 3A. When photo-annealing is performed, the film is contracted slightly by crystallization. A dot line of the figure represents a size of the island semiconductor region before the photo-annealing. In this contract process, a region 33 that distortion is accumulated in an outermost portion of the island semiconductor region 31 is formed. The crystallinity of such the region 33 is not high so much. (FIG. 3B)

Figure 3D:
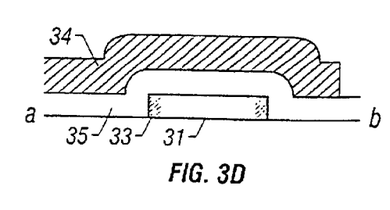

In a case wherein a gate electrode 34 is formed across such the island region (FIG. 3C), in an (a-b) cross section (FIG. 3D) along the gate electrode, the region 33 that distortion is accumulated is to be formed under the gate electrode 34 and a gate insulating film 35. When a voltage is applied to the gate electrode 34, since an interface characteristic between the region 35 and the gate insulating film is not good, charges are trapped, so that deterioration occurs by a parasitic channel or the like due to the charges. (FIG. 3D)

SUMMARY OF THE INVENTION

The object of the present invention is to prevent such the deterioration, and to provide a method for producing an insulated gate semiconductor device having less deterioration.

According to a first aspect of the present invention, the following processes are obtained.

(1) An amorphous semiconductor film is etched into a first shape that a width of a narrowest portion is 100 μm or less, to form an island semiconductor region.

(2) The semiconductor region is photo-annealed to crystalize it or to increase the crystallinity thereof.

(3) Of end portions (or peripheral portions) of the semiconductor region, at least a gate electrode or a channel forming region of a semiconductor device is etched by 10 μm or more from ends, to form a semiconductor region having a second shape.

Also, according to a second aspect of the present invention, the following processes are obtained.

(1) An amorphous semiconductor film is etched into a first shape that a width of a narrowest portion is 100 μm or less, to form an island semiconductor region.

(2) The semiconductor region is photo-annealed to crystalize it or to increase the crystallinity thereof.

(3) At least a part of end portions (or peripheral portions) of the semiconductor region is etched.

(4) An gate insulating film is formed to cover the semiconductor region.

(5) An gate electrode is formed across the etched portion of the end portions of the semiconductor region.

(6) An N-type or P-type impurity is introduced or diffused using the gate electrode as a mask.

In the first and second aspects of the present invention, the first shape is one of a rectangle, a regular polygon and an ellipse (including a circle), and generally it is preferred that a shape does not include a concave portion at any point on a periphery.

In the above structure, an amorphous silicon film is formed on a substrate having an insulating surface, such as a glass substrate or a quartz substrate by plasma chemical vapor deposition (plasma CVD) and low pressure thermal CVD. In photo-annealing, various excimer lasers such as a KrF excimer laser (wavelength of 248 nm) and a XeCl excimer laser (wavelength of 308 nm), and a Nd:YAG laser (wavelength of 1064 nm) and a second harmonic component (wavelength of 532 nm) and a third harmonic component (wavelength of 355 nm) may be used. In the present invention, a light source may pulse-oscillate or continuous-oscillate. As disclosed in Japanese Patent Application Open No. 6-318701, in photo-annealing, crystallization may be promoted using a metal element (for example, Fe, Co, Ni, Pd or Pt) which promotes crystallization of silicon.

The present invention disclosed in the specification is effective in a case wherein an island semiconductor region is constructed in a single-crystalline region or a region equivalent to the single-crystalline region. As described later, the single-crystalline region or the region equivalent to the single-crystalline region can be obtained by scan-irradiating a linearly processed laser light into an amorphous silicon film and a crystalline silicon film.

The single-crystalline region or the region equivalent to the single-crystalline region is defined as a region that the following conditions are satisfied.

(1) The region does not contain substantially crystal boundary.

(2) The region contains hydrogen or a halogen element to neutralize a point defect at a concentration of $1 \times 10^{15}$ to $1 \times 10^{20}$ atoms cm$^{-3}$.

(3) The region contains carbon or nitrogen at a concentration of $1 \times 10^{16}$ to $5 \times 10^{18}$ atoms cm$^{-3}$.

(4) The region contains oxygen at a concentration of $1 \times 10^{17}$ to $5 \times 10^{19}$ atoms cm$^{-3}$.

The above concentrations are defined as a minimum value of a measurement value measured by secondary ion mass spectrometry (SIMS).

In the present invention disclosed in the specification, only a channel portion is etched so as not to be adjacent to a channel that influences characteristics of a semiconductor device. This corresponds to that etching is performed so as not to remain such a region in a portion which crosses a gate electrode.

Figure 1A:
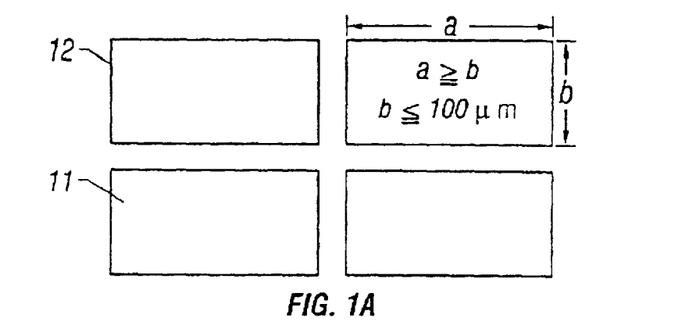
FIGS. 1A to 1D show schematic producing processes (upper views) of the present invention.

FIGS. 1A to 1D show a basic structure of the present invention. A plurality of island amorphous semiconductor regions 11 (four regions in the figures) are formed into a rectangle 12 having a long side (a) and a short side (B) as a first shape. In the present invention, it is required that a width of the narrowest portion of the first shape is 100 μm or less. This is because, when the width is 100 μm or more, an effect for characteristic improvement due to contraction of a film at photo-annealing is not obtained. Thus (b) is 100 μm or less in length. (FIG. 1A)

Figure 1B:
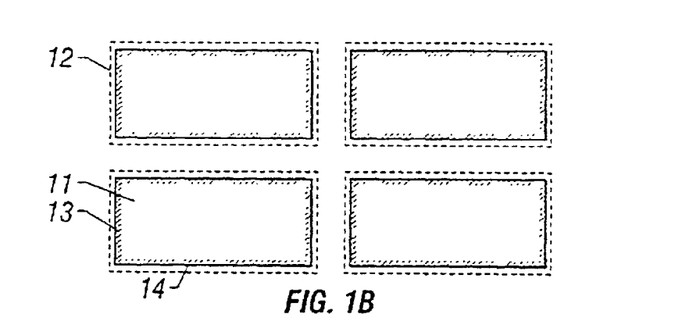
Figure 1C:
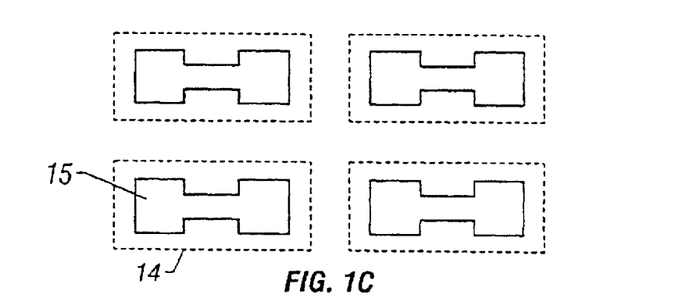

Next, photo-annealing is performed. Thus, the island semiconductor regions are crystallized and contracted at the same time. A dot line of the figure represents a size of the island semiconductor regions before the photo-annealing. New peripheries of the island regions are represented by numeral 14. Regions 13 that distortion is accumulated due to distortion process can be formed in peripheral portions of the island semiconductor regions (FIG. 1B)

Figure 1D:
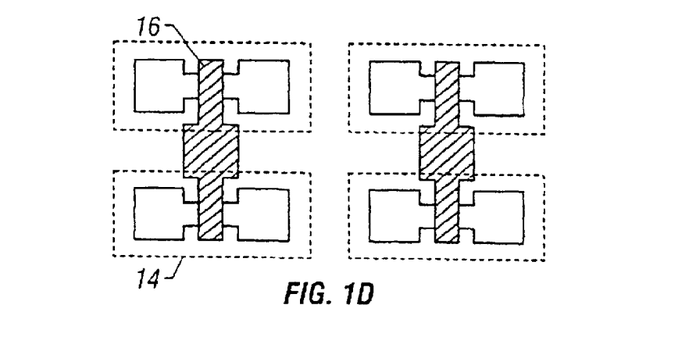

Then, the peripheral portions of the island semiconductor regions 11 is etched to form a semiconductor region 15 for the formation of necessary elements (FIG. 1C), and an gate insulating film (not shown) and a gate electrode 16 are formed. (FIG. 1D)

Figure 2A:
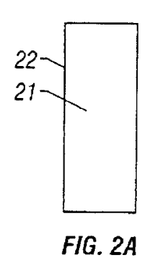
FIGS. 2A to 2D show schematic producing processes (upper views) of the present invention.
Figure 2B:
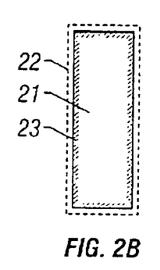
Figure 2C:
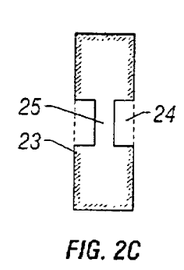

When it is not necessary that all the regions 13 that distortion is accumulated is removed, a method as shown in FIGS. 2A to 2D can be used. In this method, an amorphous semiconductor region 21 having a rectangle 22 is formed (FIG. 2A), and then photo-annealed. As a result, as shown in FIGS. 1A to 1D, the semiconductor region 21 is contracted, so that a region 23 that distortion is accumulated is formed in a peripheral portion. (FIG. 2B)

Figure 2D:
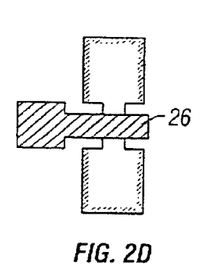

A region including a peripheral portion of a region that a gate electrode is formed is etched (FIG. 2C), and than a gate insulating film (not shown) and a gate electrode 26 are formed. Since the region 23 that distortion is accumulated is not included in a channel 25 formed under the gate electrode 26, as similar to a case of FIGS. 1A to 1D, deterioration can be decreased (FIG. 2D)

Figure 4A:
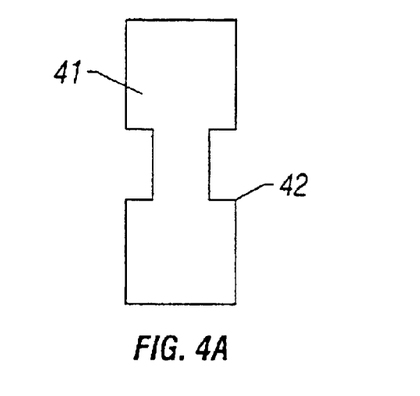
FIGS. 4A to 4c are views explaining a stress applied to a thin film semiconductor at photo-annealing.
Figure 4B:
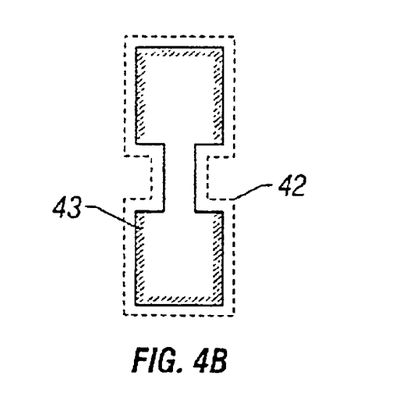

In the present invention, it is preferred that an amorphous semiconductor region at photo-annealing has a possible simple shape with respect to the first shape, for example, a rectangle, a regular polygon and an ellipse including a circle. When, as shown in FIG. 4A, a semiconductor region 41 having a shape 42 that a central portion is concave is photo-annealed, since a concave portion 44 of the central portion is pulled in upper and lower directions (for a source and a drain, for example) at contraction of a film, crack or the like generates easily in this region. (FIGS. 4B and 4C)

Figure 4C:
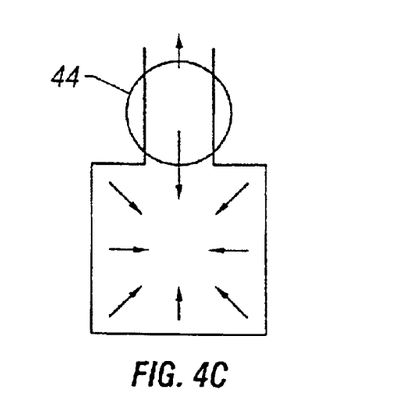

This is because, as shown in FIG. 4C (an arrow represents a contraction direction), contraction of a film occurs from a widest portion. Thus, it is desired that the first shape is not a shape having a concave portion, but is a shape having a convex portion in the whole region or a shape not having a concave portion in the whole region.

Therefore, even if the rectangle as shown in FIGS. 1A to 1D is used as the first shape, it is not preferred that a ratio between the long side (a) and the short side (b) is very large. It is preferred that $a/b \leq 10$.

Also, when an island semiconductor region is constructed as a region equivalent to a single-crystalline region or a region substantially equivalent to the single-crystalline region, at crystallization distortion is accumulated in a peripheral portion of the island semiconductor region.

Since this distortion concentrates in the peripheral portion of the island semiconductor region, influence by this distortion can be suppressed by removing a portion around the island semiconductor region.

DETAILED DESCRIPTION OF THE PREFERRED EMBODIMENTS

[Embodiment 1]

The embodiment is described with FIGS. 5A to 5F. In FIGS. 5A to 5F, cross sections of two thin film transistors (TFTs) is shown. A left is a cross section obtained by cutting a TFT in vertical to a gate electrode thereof (in vertical to a-b in FIG. 3C), and a right is a cross section obtained by cutting a TFT in parallel with a gate electrode thereof (along a-b in FIG. 3C). An upper view is referred with FIG. 1D.

Figure 5A:
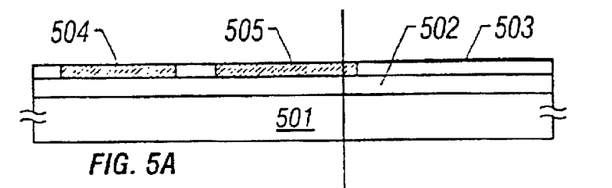
FIGS. 5A to 5F show producing processes in Embodiment 1.

A silicon oxide film 502 having a thickness of 3000 Å is formed as a base film on a glass substrate 501 by sputtering or plasma chemical vapor deposition (plasma CVD). Also, By plasma CVD or low pressure thermal CVD, an amorphous silicon film 503 having a thickness of 500 Å is formed. Phosphorus is doped into the amorphous silicon film 503 to form N-type impurity region 504 and 505 which become a source and a drain in a TFT. (FIG. 5A)

Figure 5B:
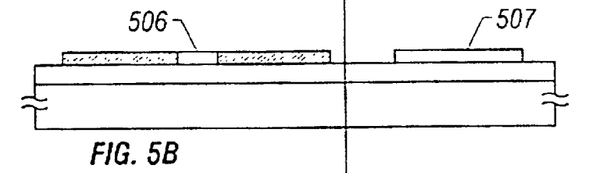

The amorphous silicon film 503 is etched to form island silicon regions 506 and 507. (FIG. 5B)

A KrF excimer laser light is irradiated to crystallize a silicon film. At this irradiation the regions 504 and 505 into which the phosphorus is introduced are crystallized and activated at the same time. A energy density of the laser is preferably 150 to 500 mJ/cm$^2$. The laser irradiation process may include two steps or more using laser lights at different energy.

In the embodiment, after a laser light having an energy density of 250 mJ/cm$^2$ is irradiated two to ten pulses, a laser light having an energy density of 400 mJ/cm$^2$ is irradiated two to ten pulses. A substrate temperature at laser irradiation is set to 200° C. A suitable energy density of the laser depends on a substrate temperature and a film quality of the amorphous silicon film 503.

Figure 5C:
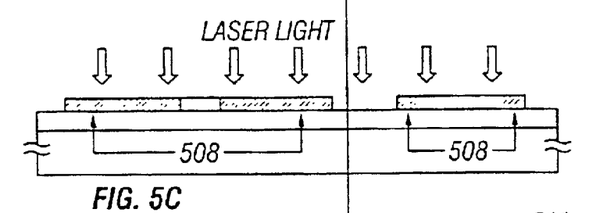

As a result, regions 508 that distortion is accumulated are formed in end portions (peripheral portions) of the island silicon regions 506 and 507. (FIG. 5C)

Figure 5D:
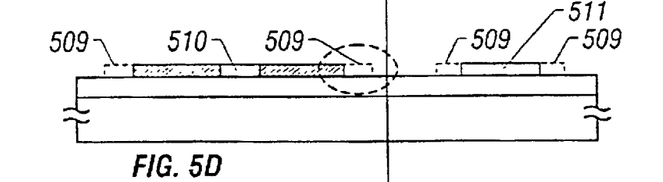

End portions 509 of the island silicon regions 506 and 507 are etched to form new island silicon regions 510 and 511. Portions etched by this process are shown by dot lines 509. (FIG. 5D)

Figure 5E:
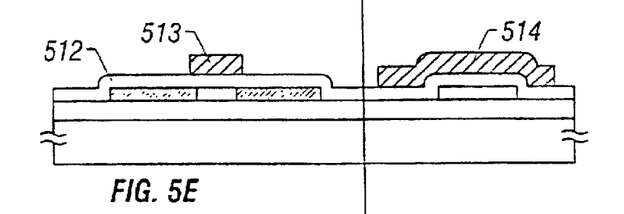

By plasma CVD, a silicon oxide film 512 (gate insulating film) having a thickness of 1200 Å is formed. Also, an aluminum film (containing 0.3% scandium (Sc)) having a thickness of 5000 Å is deposited on the film 512 by sputtering and then etched to form gate electrodes 513 and 514. (FIG. 5E)

Figure 5F:
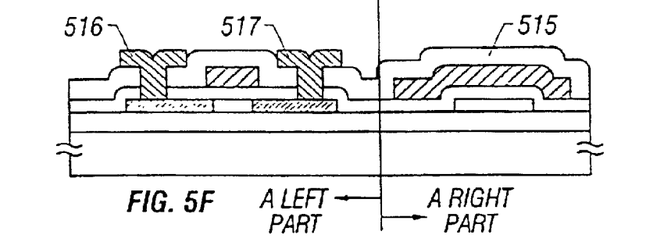

By plasma CVD, a silicon oxide film 515 (interlayer insulator having a thickness of 5000 Å is deposited, and then contact holes are formed in the film 515. By sputtering, an aluminum film having a thickness of 5000 Å is deposited and etched to form electrode-wirings 516 and 517 for a source and a drain. (FIG. 5F)

By the above processes, a TFT is produced. To obtain a stable characteristic, it is preferred that annealing is performed at one (atmospheric) pressure in an atmosphere containing hydrogen (250 to 350° C.) after a contact hole forming process.

[Embodiment 2]

The embodiment is described with FIGS. 6A to 6G. As similar to FIGS. 5A to 5F, In FIGS. 6A to 6G, cross sections of two thin film transistors (TFTs) is shown. A left is a cross section obtained by cutting a TFT in vertical to a gate electrode thereof, and a right is a cross section obtained by cutting a TFT in parallel with a gate electrode thereof. An upper view is referred with FIG. 2D.

Figure 6A:
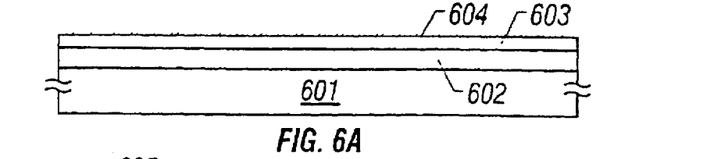
FIGS. 6A to 6G show producing processes in Embodiment 2.

A silicon oxide film 602 having a thickness of 3000 Å is formed as a base film on a glass substrate 601 by sputtering or plasma CVD. Also, By plasma CVD or low pressure thermal CVD, an amorphous silicon film 603 having a thickness of 500 Å is formed. An aqueous solution containing nickel acetate (or cobalt acetate) at 1 to 100 ppm is applied to a surface of the film 603 to form a nickel acetate (cobalt acetate) layer 604. Since the nickel acetate (cobalt acetate) layer 604 is extremely thin, it is not always in a film form. (FIG. 6A)

Figure 6B:
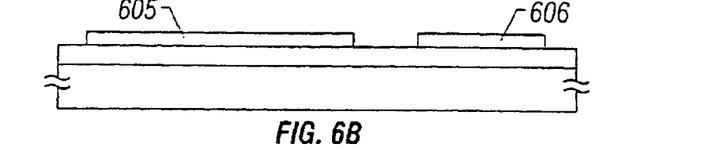

Thermal annealing is performed at 350 to 450° C. for 2 hours in an atmosphere containing nitrogen, to decompose nickel acetate (cobalt acetate) and diffuse nickel (or cobalt) into the amorphous silicon film 603 at the same time. Then, the amorphous silicon film 603 is etched to from island silicon regions 605 and 606. (FIG. 6B)

A KrF excimer laser light is irradiated to crystallize a silicon film by photo-annealing. In the embodiment, after a laser light having an energy density of 200 mJ/cm$^2$ is irradiated two to ten pulses, a laser light having an energy density of 350 mJ/cm$^2$ is irradiated two to ten pulses. A substrate temperature at laser irradiation is set to 200° C.

A suitable energy density of the laser depends on a concentration of the applied nickel (cobalt) in addition to a substrate temperature and a film quality of the amorphous silicon film. In the embodiment, it has confirmed that a concentration of nickel (cobalt) contained in the amorphous silicon film is $1 \times 10^{18}$ to $5 \times 10^{18}$ atoms/cm$^3$ from the analysis result by secondary ion mass spectrometry (SIMS).

A method for performing photo-annealing using a catalytic element which promotes crystallization is disclosed in Japanese patent Application Open No. 6-318701.

Figure 6C:
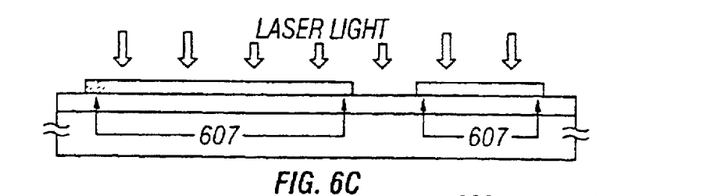

As a result, regions 607 that distortion is accumulated are formed in end portions (peripheral portions) of the island silicon regions 605 and 606. (FIG. 6C)

Figure 6D:
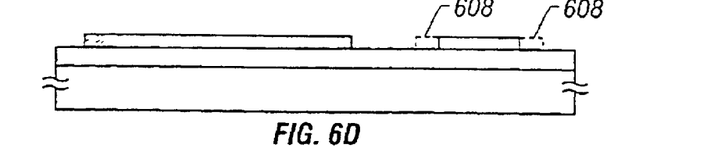

In end portions 607 of the island silicon regions 605 and 606, only portions which cross a gate electrode are etched to form new island silicon regions. The portions etched by this process are shown by dot lines 608. (FIG. 6D)

Figure 6E:
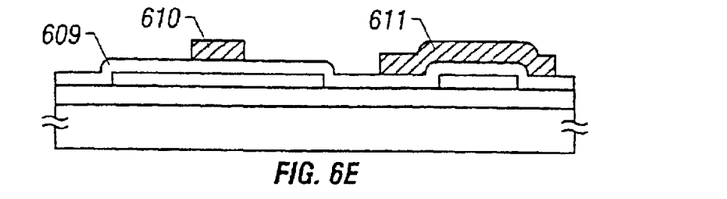

By plasma CVD, a silicon oxide film 609 (gate insulating film) having a thickness of 1200 Å is formed. Also, a polycrystalline silicon film (containing 1% phosphorus) having a thickness of 5000 Å is deposited on the film 609 by low pressure CVD and then etched to form gate electrodes 610 and 611. (FIG. 6E)

By ion doping, an phosphorus ion is introduced into a silicon film using the gate electrode as a mask. A doping gas is phosphine (PH$_3$) diluted with hydrogen at 5%. An accelerating voltage is preferably 60 to 110 kV. A dose is $1 \times 10^{14}$ to $5 \times 10^{15}$ atoms/cm$^2$. Thus, N-type impurity regions (source and drain) 612 and 613 are formed.

After the doping, thermal annealing is performed at 450° C. for 4 hours, Thus, the impurity can be activated. This is because nickel (cobalt) is contained in a semiconductor region. (See Japanese Patent Application Open No. 6-267989)

After the thermal annealing process for activation, photoannealing may be performed by irradiating a laser light or the like.

Figure 6F:
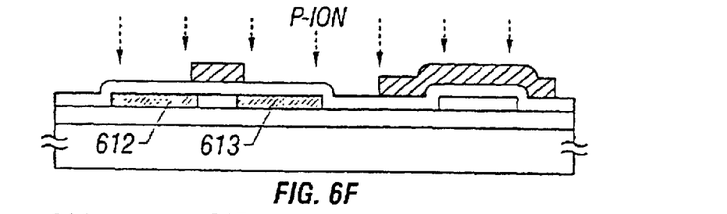

After the above process, annealing is performed at one atmospheric pressure in an atmosphere containing hydrogen (250 to 350° C.), to neutralize dangling bonds in an interface between a gate insulating film and a semiconductor region. (FIG. 6F)

Figure 6G:
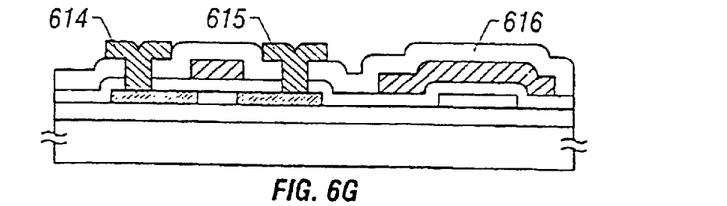

By plasma CVD, a silicon oxide film 616 (interlayer insulator having a thickness of 5000 Å is deposited, and then contact holes are formed in the film 616. By sputtering, an aluminum film having a thickness of 5000 Å is deposited and etched to form electrode-wirings 614 and 615 for a source and a drain. (FIG. 6G)

[Embodiment 3]

In the embodiment, a metal element which promotes crystallization of silicon is introduced into an amorphous silicon film and then a laser light is irradiated to form a region substantially equivalent to a single-crystalline region, so that an active layer of a TFT is constructed using the region substantially equivalent to the single-crystalline region.

FIGS. 7A to 7E show a part of producing processes of a TFT according to the embodiment. A silicon oxide film 702 having a thickness of 3000 Å is formed as a base film on a glass substrate 701 by plasma CVD or sputtering. Also, an amorphous silicon film 703 having a thickness of 500 Å is formed by plasma CVD or low pressure thermal CVD.

Figure 7A:
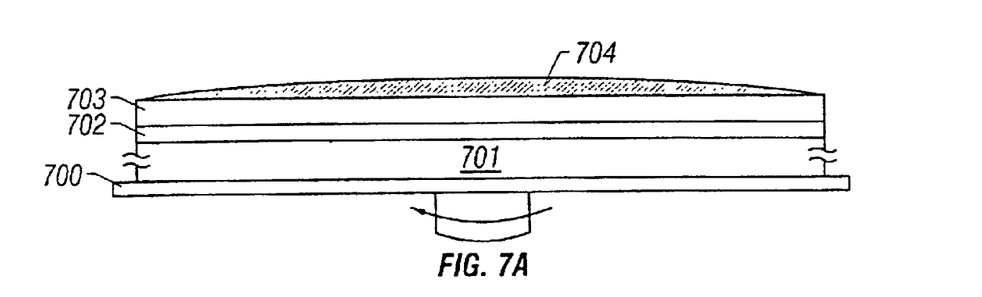
FIGS. 7A to 7E and 8A to 8C show producing processes in Embodiment 3.

A sample formed on the substrate is placed on a spinner 700. In this state, a nickel acetate solution having an adjusted nickel concentration is applied to the sample to form an aqueous (water) film 704. This state is shown in FIG. 7A. By spin dry using the spinner 700, an unnecessary nickel acetate solution is removed (blown away). Thus, a state that a small amount of nickel is held in contact with the surface of the amorphous silicon film is obtained.

Figure 7B:
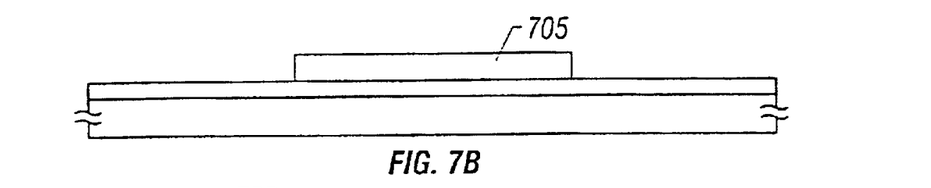

By patterning, an active layer 705 of a TFT is formed. At this state, the active layer 705 is constructed by the amorphous silicon film 703. (FIG. 7B)

In this state, a laser light is irradiated to crystalize the active layer 705 made of the amorphous silicon film 703. The used laser light is processed into a linear beam. The laser light is irradiated from one side of the active layer 705 to an opposite side thereof while scanning the linear laser light. It is necessary to use a pulse-oscillated excimer laser as a laser light. In the embodiment, a KrF excimer laser (wavelength of 248 nm) is used.

The laser light is irradiated while a substrate is heated at 500° C. This is because of the relaxation or large change of a crystal structure due to laser light irradiation. It is preferred that the heating temperature is 450° C. to a temperature equal to and lower than the distortion point of a glass substrate.

When the linear laser light is irradiated into the amorphous silicon film, a region into which the laser light is irradiated is melted instantaneously. By irradiating the linear laser light while scanning it, crystal growth progresses gradually. Thus, the region equivalent to the single-crystalline region can be obtained.

Figure 7C:
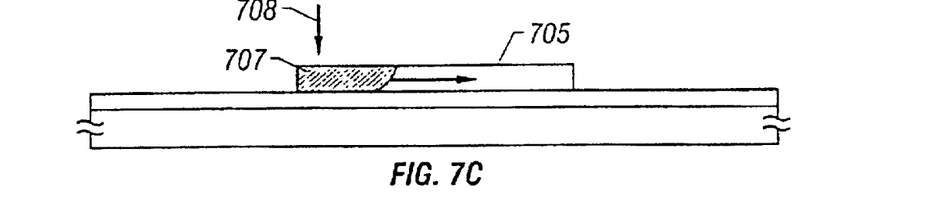

That is, as shown in FIG. 7C, in a case wherein a linear laser light 708 is irradiated gradually from one end portion of the active layer 705 constructed by the amorphous silicon film 703 to the other portion thereof while scanning it, a region 707 equivalent to the single-crystalline region is crystal-grown in accordance with the laser light irradiation, the whole active layer 705 can be obtained at a single-crystalline equivalent state.

Figure 7D:
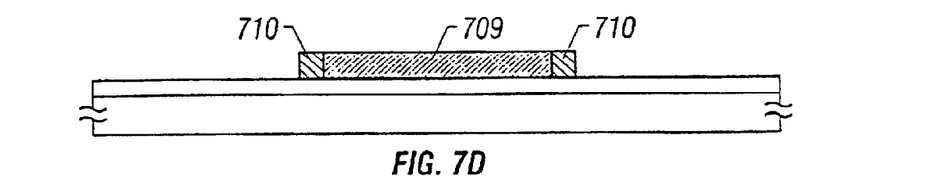

Thus, an active layer 709 constructed by a silicon thin film equivalent to a single-crystalline thin film is obtained. (FIG. 7D)

The region equivalent to the single-crystalline region is required to satisfy the following conditions.

(1) The region does not contain substantially crystal boundary.

(2) The region contains hydrogen or a halogen element to neutralize a point defect at a concentration of $1\times10^{15}$ to $1\times10^{20}$ atoms $cm^{-3}$.

(3) The region contains carbon or nitrogen at a concentration of $1\times10^{16}$ to $5\times10^{18}$ atoms $cm^{-3}$.

(4) The region contains oxygen at a concentration of $1\times10^{17}$ to $5\times10^{19}$ atoms $cm^{-3}$.

In a case wherein the metal element which promotes crystallization of silicon, as described in the embodiments is used, it is necessary to contain the metal element at a concentration of $1\times10^{16}$ to $5\times10^{19}$ $cm^{-3}$ in a film. If the metal element is contained at a concentration larger than the concentration range, a semiconductor characteristic is not obtained but a metallic characteristic is obtained. Also if the metal element is contained at a concentration lower than the concentration ranges an action for promoting crystallization of silicon cannot be obtained.

From the above description, the silicon film region which is obtained by the laser light irradiation and is equivalent to the single-crystalline region is essentially different from a commonly called single-crystal such as a single-crystalline wafer.

At crystallization by the laser light irradiation, contraction of a film occurs, and the distortion is accumulated largely toward peripheral portions of the active layer 709. That is, the distortion is concentrated in a portion 710 as shown in FIG. 7D and accumulated.

In general, a thickness of the active layer is about several hundreds Å to several thousands Å. A size thereof is several μm square to several hundreds μm square. That is, it is extremely thin and has a thin film form. In such a thin film form state, if crystal growth as shown in FIG. 7C progresses, the distortion is concentrated in a peripheral portion, i.e., a portion around a region that crystal growth is completed or a region that crystal growth does not progress any more.

From the above two causes, the distortion is concentrated around the active layer. It is not preferred that a region in which such distortion is concentrated is present in the active layer 709 since the region may influence the operation of a TFT.

Figure 7E:
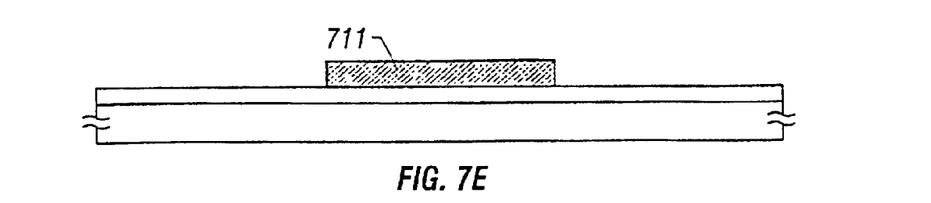

Thus, in the embodiment, the whole peripheral portion of the active layer 709 is etched, As a result, an active layer 711 which is constructed by the region substantially equivalent to the single-crystalline region and in which influence due to stress is reduced can be obtained. (FIG. 7E)

Figure 8A:
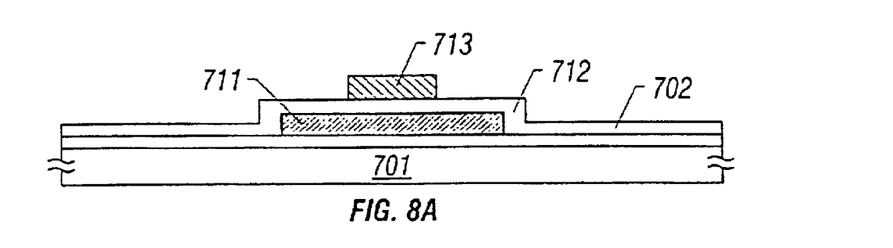

After the active layer 711 is obtained, as shown in FIG. 8A, a silicon oxide film having a thickness of 1000 Å is formed as a gate insulating film 712 by plasma CVD, to cover the active layer 111. A poly-crystalline silicon film into which a large amount of phosphorus (P) is doped is formed at a thickness of 5000 Å by low pressure thermal CVD and then patterned to from a gate electrode 713. (FIG. 8A)

Figure 8B:
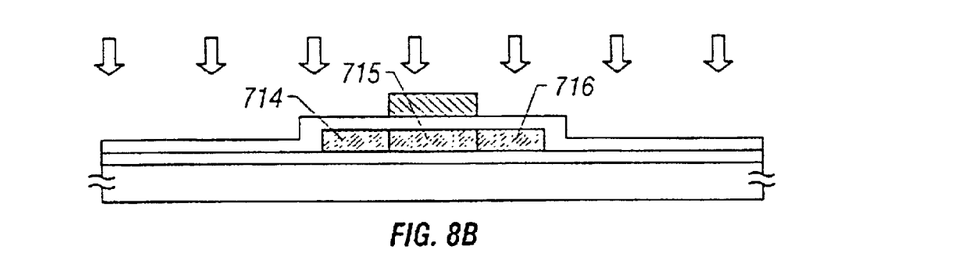

An phosphorus (P) ion is implanted by plasma doping or ion implantation, to form a source region 714 and a drain region 716 in a self-alignment. Also, by using the gate electrode 713 as a mask, a region 715 into which an impurity ion (phosphorus) is not implanted is determined as a channel forming region. (FIG. 8B)

Figure 8C:
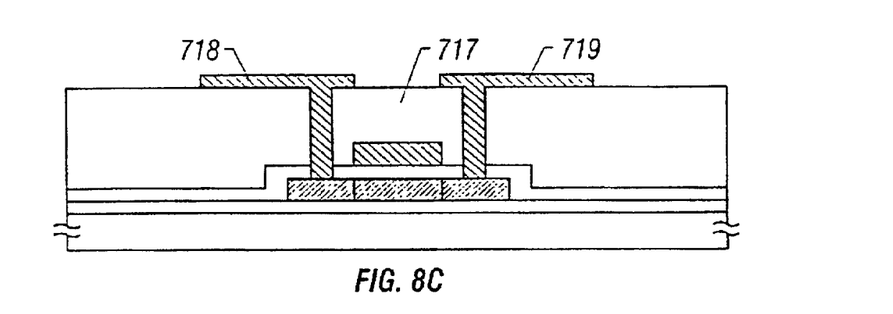

A silicon oxide film 717 having a thickness of 7000 Å is formed as an interlayer insulating film by plasma CVD using a tetraethoxysilane (TEOS) gas. After forming contact holes, source and drain electrodes 718 and 719 are formed using a multilayer film of titanium and aluminum. Although not shown in figures, a contact electrode for the gate electrode 713 is formed at the same time. Then, heating treatment is performed at 350° C. for 1 hour in an atmosphere containing hydrogen, to complete a TFT as shown in FIG. 8C.

Since the obtained TFT is constructed by a silicon film of which the active layer is equivalent to single-crystal, an electrical characteristic of the obtained TFT can be almost equal to that of a TFT which is produced using an SOI technique or the like and constructed using a single-crystalline silicon film.

[Embodiment 4]

In the embodiment, a manner for irradiating a laser light into an amorphous silicon film patterned to construct an active layer is modified in the structure of Embodiment 3, in order to crystallize it easily.

Figure 9:
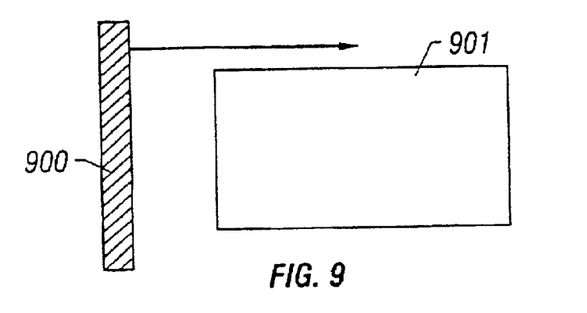
FIGS. 9 and 10 are upper views representing a state that a linear laser light is irradiated into an active layer (island semiconductor region.

FIG. 9 shows a method for irradiating a laser light into an active layer in the processes according to Embodiment 3. In this method, a linear laser light having a longitudinal direction is irradiated in parallel with one side of a patterned amorphous silicon film 901 (since this film becomes an active layer later, it is called the active layer). By scanning along a direction of an arrow while irradiating the laser light, the active layer 901 is converted into the region equivalent to a single-crystalline region.

Figure 10:
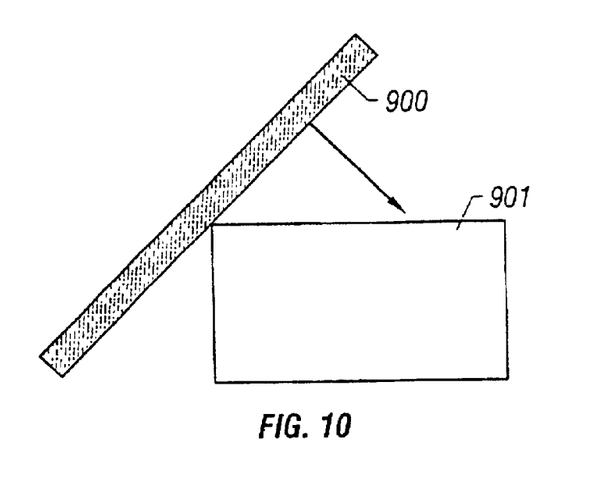
Figure 11:
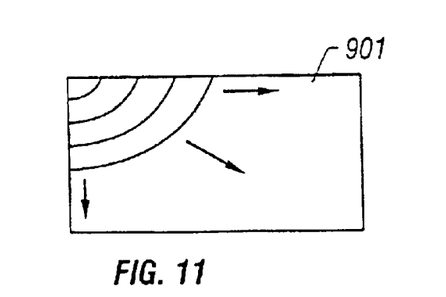
FIG. 11 is an upper view representing a crystallization state when a linear laser light is irradiated into an active layer (island semiconductor region).

In the method according to the embodiment, a scan direction of the linear laser light 900 can be set so as to progress crystal growth form a corner portion of the active layer 901, as shown in FIG. 10. When the laser light irradiation method of FIG. 10 is used, since crystal growth progresses gradually from a narrow region toward a wide region, as shown in FIG. 11, the progress of crystal growth is performed easily. In comparison with a case wherein the laser light is irradiated in the state as shown in FIG. 9, the region equivalent to the single-crystalline region can be formed and high repeatability can be obtained.

According to the present invention, deterioration of an insulated gate type semiconductor device produced using a semiconductor device crystallized by photo-annealing can be decreased. Although, n the embodiments, a silicon semiconductor is mainly described, the same effect is also obtained in another semiconductor such as a silicon-germanium alloy semiconductor, a zinc sulfide semiconductor and a silicon carbide semiconductor. Thus, the present invention has an industrial value.

What is claimed is:

1. A method of manufacturing a semiconductor device comprising the steps of:
    forming an amorphous semiconductor film over a substrate;
    irradiating the amorphous semiconductor film with a third harmonic of a continuous wave laser comprising Nd to crystallize the amorphous semiconductor film; and
    patterning the crystallized semiconductor film to form an active layer including at least a channel formation region.

2. The method according to claim 1 wherein said amorphous semiconductor film comprises amorphous silicon.

3. The method according to claim 1 wherein said continuous wave laser comprising Nd is an Nd:YAG laser.

4. A method of manufacturing a semiconductor device, the method comprising:
    forming an amorphous semiconductor film over a substrate;
    irradiating the amorphous semiconductor film with a third harmonic of a laser comprising Nd to crystallize the amorphous semiconductor film; and
    patterning the crystallized semiconductor film to form an active layer including at least a channel formation region.

5. The method according to claim 4 wherein said amorphous semiconductor film comprises amorphous silicon.

6. The method according to claim 4 wherein said laser comprising Nd is a Nd:YAG laser.

* * * * *